US010622997B2

(12) United States Patent
Lopes et al.

(10) Patent No.: US 10,622,997 B2
(45) Date of Patent: Apr. 14, 2020

(54) RADIATION-RESISTANT ASYNCHRONOUS COMMUNICATIONS

(71) Applicants: Commissariat à l'Énergie Atomique et aux Énergies Alternatives, Paris (FR); Centre National de la Recherche Scientifique, Paris (FR)

(72) Inventors: Jeremy Lopes, Grenoble (FR); Grégory Di Pendina, Echirolles (FR)

(73) Assignees: Commissariat à l'Énergie Atomique et aux Énergies Alternatives, Paris (FR); Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 16/084,124

(22) PCT Filed: Mar. 10, 2017

(86) PCT No.: PCT/FR2017/050544
§ 371 (c)(1),
(2) Date: Sep. 11, 2018

(87) PCT Pub. No.: WO2017/153696
PCT Pub. Date: Sep. 14, 2017

(65) Prior Publication Data
US 2019/0181864 A1 Jun. 13, 2019

(30) Foreign Application Priority Data
Mar. 11, 2016 (FR) ...................................... 16 52074

(51) Int. Cl.
*G06F 9/38* (2018.01)
*H03K 19/003* (2006.01)
*G06F 11/14* (2006.01)

(52) U.S. Cl.
CPC ..... *H03K 19/00338* (2013.01); *G06F 9/3871* (2013.01); *G06F 11/14* (2013.01)

(58) Field of Classification Search
CPC ........... H03K 5/15026; H03K 19/0016; H03K 19/00338; H03K 19/01707
See application file for complete search history.

(56) References Cited

U.S. PATENT DOCUMENTS 7,065,665 B2 * 6/2006 Jacobson .............. G06F 1/3203
   712/219
8,362,802 B2 * 1/2013 Nowick ............... H03K 19/173
   326/104
(Continued)

FOREIGN PATENT DOCUMENTS

EP    2 993 786 A1   3/2016

OTHER PUBLICATIONS

International Search Report and Written Opinion dated Jun. 13, 2017 in connection with International Application No. PCT/FR2017/050544.

(Continued)

*Primary Examiner* — Alexander H Taningco
*Assistant Examiner* — Kurtis R Bahr
(74) *Attorney, Agent, or Firm* — Wolf, Greenfield & Sacks, P.C.

(57) ABSTRACT

An asynchronous circuit which includes a first circuit suitable for receiving, from a first other circuit, a first data input signal, and for generating a first acknowledgement of receipt signal and a first data output signal; a second circuit suitable for receiving, from a second other circuit, a second data input signal, and for generating a second acknowledgement of receipt signal and a second data output signal, the second circuit being functionally equivalent to the first circuit; a comparator suitable for detecting an inconsistency between the first and second data input or output signals; and at least one circuit for pausing an acknowledgement of receipt suitable for preventing the propagation of the first and second acknowledgement of receipt signals towards the first and second other circuits if an inconsistency is detected by the comparator.

9 Claims, 5 Drawing Sheets

(56) References Cited

U.S. PATENT DOCUMENTS

| | | | | |
|---|---|---|---|---|
| 2007/0262786 A1* | 11/2007 | Manohar | .......... | H03K 19/00338 |
| | | | | 326/14 |
| 2010/0185909 A1* | 7/2010 | Li | .................. | G01R 31/318541 |
| | | | | 714/726 |
| 2010/0268987 A1* | 10/2010 | Clark | .................... | G06F 9/3867 |
| | | | | 714/16 |
| 2015/0268962 A1* | 9/2015 | Checka | ................. | G06F 9/3871 |
| | | | | 712/1 |

OTHER PUBLICATIONS

Conraux et al., Effects of swift heavy ion bombardment on magnetic tunnel junction functional properties. Journal of Applied Physics. May 15, 2003; 93(10): 7301-3.

Jang et al., SEU-tolerant QDI Circuits. 11th IEEE International Symposium on Asynchronous Circuits and Systems. 2005 IEEE; 10pp.

Monnet et al., Hardening Techniques against Transient Faults for Asynchronous Circuits. 11th IEEE International On-Line Testing Symposium. 2005; 6pp.

Pontes et al., Adding Temporal Redundancy to Delay Insensitive Codes to Mitigate Single Event Effects. IEEE 18th International Symposium on Asynchronous Circuits and Systems. 2012; 142-9. DOI 10.1109/ASYNC.2012.26.

Rajaei et al., Soft Error-Tolerant Design of MRAM-Based Non-volatile Latches for Sequential Logics. IEEE Transactions on Magnetics. Jun. 2015; 51(6): 14pp.

\* cited by examiner

RADIATION-RESISTANT ASYNCHRONOUS COMMUNICATIONS

CROSS-REFERENCE TO RELATED APPLICATIONS

This application is a national stage filing under 35 U.S.C. 371 of International Patent Application Serial No. PCT/FR2017/050544, filed Mar. 10, 2017, which claims priority to French patent application FR16/52074, filed Mar. 11, 2016. The entire contents of these applications are incorporated herein by reference in their entirety.

FIELD

The present disclosure relates to the field of asynchronous communications, and in particular to radiation-hardened asynchronous circuits.

BACKGROUND

In contrast with synchronous circuit designs that rely on a clock signal, asynchronous circuits have the advantage of being more or less insensitive to delay variations resulting for example from variations in the manufacturing process. Furthermore, by avoiding the use of a clock, asynchronous circuits have relatively low power consumption. Asynchronous circuits are generally designed to operate based on events determined using a specific handshake protocol.

The basic circuit element of an asynchronous design is a circuit known as a C-element or Muller cell. This circuit includes a volatile latch for storing a state. Thus if the asynchronous circuit is powered down, the data stored by the various C-elements will be lost.

An asynchronous pipeline is generally formed in stages, each stage comprising a half buffer formed of several C-elements.

For aviation and/or spatial applications, it would be desirable to provide an asynchronous circuit that is rendered robust against the effects of radiation. Indeed, the presence of ionising particles at high altitudes or in space can induce currents in integrated circuits that may be enough to cause a flip in the binary state held by one or more gates. This may cause the circuit to malfunction, known in the art as a single event upset (SEU).

It has been proposed to provide dual modular redundancy (DMR) or triple modular redundancy (TMR) in an asynchronous circuit design in order to provide radiation protection. Such techniques rely on duplicating the circuit in the case of DMR, or triplicating the circuit in the case of TMR, and detecting a discordance between the outputs of the circuits as an indication of the occurrence of an SEU.

A problem with the DMR technique is that it does not permit the error to be corrected, and thus when an error is detected, the circuit is simply reset. This adds a time delay, as the processing operation must be restarted. Furthermore, if SEUs occur at a relatively high rate, it may even be impossible for a processing operation to be completed before a reset is required.

The TMR technique does allow the error to be corrected, for example by selecting the output value generated by two out of three of the circuits. However, a drawback with the TMR technique is that the surface area and power consumption of the circuit are increased by a factor of three.

There is thus a need in the art for a circuit having relatively low surface area and power consumption, and that allows recovery following an SEU without requiring a reset.

SUMMARY

It is an aim of embodiments of the present disclosure to at least partially address one or more needs in the prior art.

According to one aspect, there is provided an asynchronous circuit comprising: a first circuit adapted to receive, from a first further circuit, a first data input signal on a first data input line and to generate a first acknowledgement signal and a first data output signal; a second circuit adapted to receive, from a second further circuit, a second data input signal on a second data input line and to generate a second acknowledgement signal and a second data output signal, the second circuit being functionally equivalent to the first circuit; a comparator, the comparator either being adapted to detect a mismatch between the first and second data input signals or being adapted to detect a mismatch between the first and second data output signals; and at least one acknowledgement pause circuit adapted to prevent the propagation of the first and second acknowledgement signals to the first and second further circuits if a mismatch is detected by the comparator.

According to one embodiment, the comparator is adapted to detect a mismatch between the first and second data output signals, the circuit further comprising: a further comparator adapted to detect a mismatch between the first and second data input signals; and a non-volatile memory circuit coupled to the first data input line and adapted to store a first value of the first data input signal when the further comparator does not indicate a mismatch between the first and second data input signals.

According to one embodiment, the non-volatile memory circuit is further adapted to output the stored first value in response to a detected mismatch between the first and second output data signals.

According to one embodiment, the non-volatile memory circuit is adapted to output the stored first value on data lines transmitting the first and second data input signals.

According to one embodiment, the non-volatile memory circuit comprises at least one non-volatile storage element programmable to maintain, in a non-volatile fashion, one of a plurality of resistive states.

According to one embodiment, the at least one acknowledgement pause circuit is adapted to propagate the first and second acknowledgement signals either once the comparator indicates a match between the first and second data input signals or once the comparator indicates a match between the first and second data output signals.

According to one embodiment, each at least one acknowledgement pause circuit is a logic gate adapted to receive the first or second acknowledgement signal and an output signal of the comparator.

According to one embodiment, the first and second circuits are synchronous reception circuits, and: the first further circuit is a first synchronous transmission circuit adapted to generate the first data input signal and to transmit it to the first circuit; and the second further circuit is a second synchronous transmission circuit adapted to generate the second data input signal and to transmit it to the second circuit.

According to a further aspect, there is provided an asynchronous pipeline comprising the above asynchronous circuit, the asynchronous pipeline comprising: a first sub-pipeline comprising a first plurality of stages of which one comprises said first circuit; and a second sub-pipeline comprising a second plurality of stages of which one comprises said second circuit.

According to a further aspect, there is provided a method of detecting and correcting single event upsets in an asynchronous circuit comprising: receiving by a first circuit from a first further circuit a first data input signal on a first data input line and generating by the first circuit a first acknowledgement signal and a first data output signal; receiving by a second circuit from a second further circuit a second data input signal on a second data input line and generating by the second circuit a second acknowledgement signal and a second data output signal, the second circuit being functionally equivalent to the first circuit; comparing, by a comparator, either the first and second data input signals, or the first and second data output signals, to detect a mismatch; and preventing, by at least one acknowledgement pause circuit, the propagation of the first and second acknowledgement signals to the first and second further circuits if a mismatch is detected between the first and second data input signals or the first and second data output signals.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the following description, the term "connected" is used to designate a direct connection between circuit elements, whereas the term "coupled" is used to designate a connection that may be direct, or may be via one or more intermediate elements such as resistors, capacitors or transistors.

Figure 1:
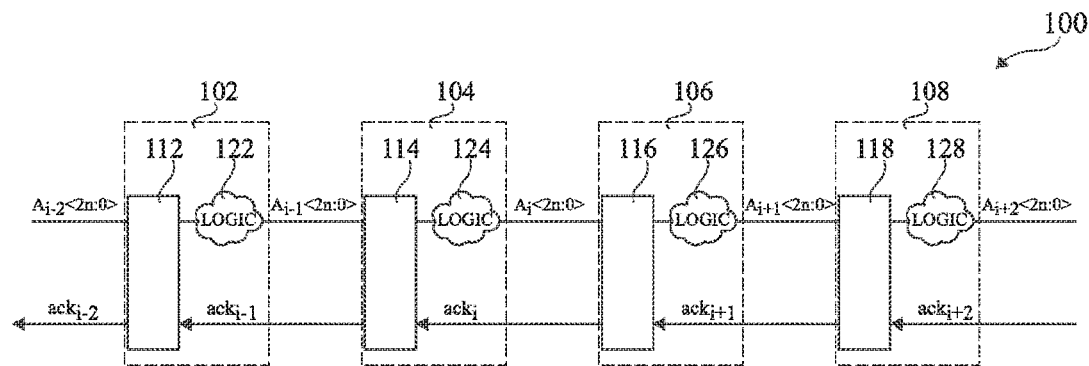
FIG. 1 schematically illustrates an asynchronous pipeline according to an example embodiment.

FIG. 1 schematically illustrates an asynchronous pipeline 100 according to an example embodiment. The pipeline 100 for example comprises at least two pipeline stages coupled in series. In the example of FIG. 1, there are four pipeline stages 102, 104, 106 and 108. Each pipeline stage 102, 104, 106 and 108 comprises a half buffer 112, 114, 116 and 118 respectively, which is for example an n-bit half buffer. The half buffers 112 to 118 respectively receive n-bit data signals on lines $A_{i-2}<2n:0>$ to $A_{i+1}<2n:0>$.

Each of the stages 102 to 108 also for example respectively comprises a logic circuit (LOGIC) 122, 124, 126 and 128, which for example performs a logic function on the data before providing the result to the subsequent stage.

While not illustrated in FIG. 1, the pipeline is for example terminated by a buffer capable of storing the data from the pipeline and of generating an acknowledgement signal to the last half-buffer of the pipeline.

Figure 2:
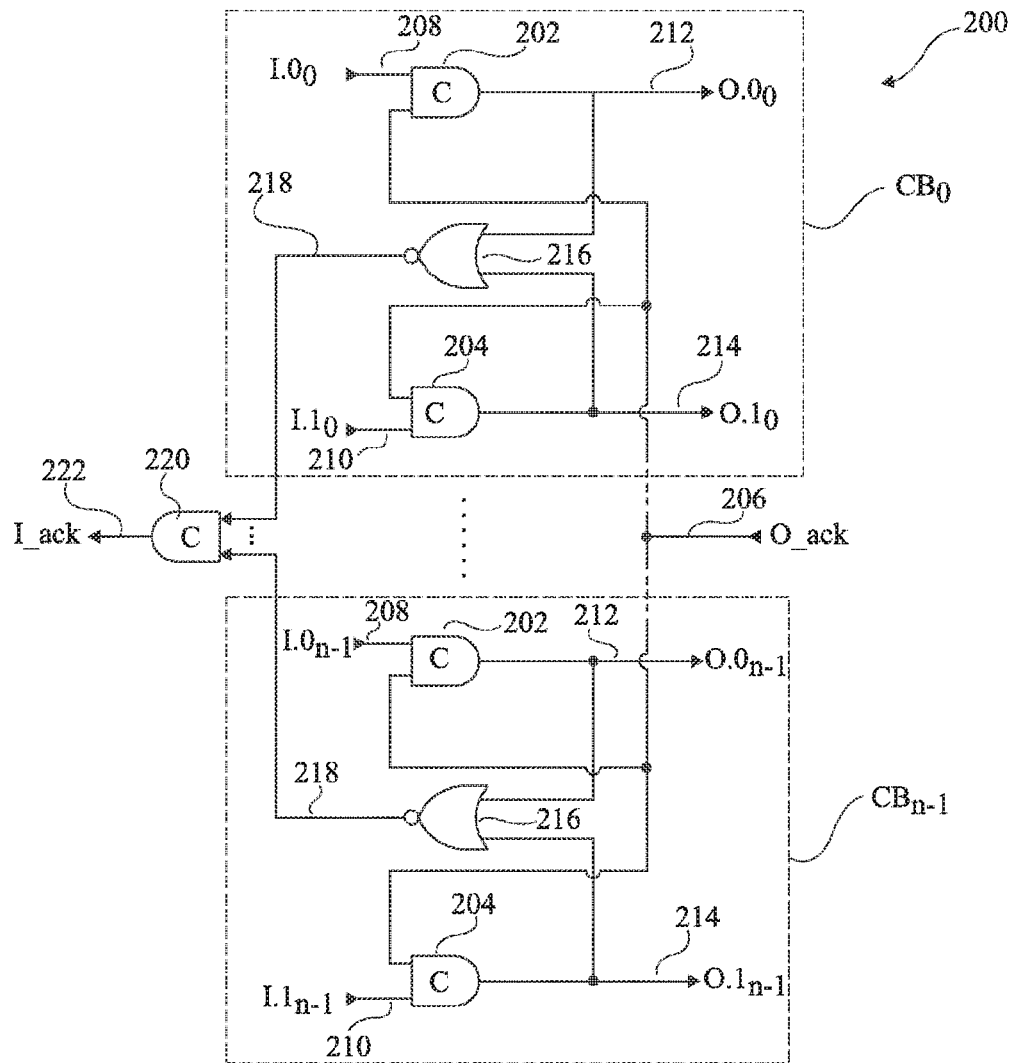
FIG. 2 schematically illustrates an N-bit half buffer according to an example embodiment.

FIG. 2 schematically illustrates an example of an n-bit half buffer 200, this circuit for example being used to implement each of the half-buffers 102 to 108 of FIG. 1. The half buffer 200 comprises n circuit blocks $CB_0$ to $CB_{n-1}$, one for each bit to be transmitted over the interface. Each circuit block $CB_0$ to $CB_{n-1}$ for example comprises a pair of C-elements 202, 204.

The C-elements 202 of the circuit blocks $CB_0$ to $CB_{n-1}$ each have one of their inputs coupled to a corresponding data input line 208 for respectively receiving corresponding input data signals $I.0_0$ to $I.0_{n-1}$, their other input coupled to an acknowledgement line 206 for receiving an acknowledgement signal O_ack from a subsequent half buffer in the pipeline, and their output coupled to a corresponding output line 212 respectively providing corresponding output signals $O.0_0$ to $O.0_{n-1}$.

The C-elements 204 of the circuit blocks $CB_0$ to $CB_{n-1}$ each have one of their inputs coupled to a corresponding data input line 210 for respectively receiving corresponding input data signals $I.1 0$ to $I.1 n-1$, their other input coupled to the acknowledgement line 206 for receiving the acknowledgement signal O_ack from a subsequent half buffer in the pipeline, and their output coupled to a corresponding output line 214 providing corresponding output signals $O.1_0$ to $O.1_{n-1}$.

The output lines 212 and 214 in each circuit block $CB_0$ to $CB_{n-1}$ are also coupled to corresponding inputs of a NOR gate 216, which generates at its output on a line 218 an acknowledgement signal for the circuit block. The acknowledgement signals on the lines 218 from each of the circuit blocks $CB_0$ to $CB_{n-1}$ are provided to corresponding inputs of the C-element 220, which provides on its output line 222 an output acknowledgement signal I_ack.

In operation, each C-element of FIG. 2 for example has an operation defined by the following truth table, where A and B are its input signals, and Z is its output signal.

| A | B | Z |
|---|---|---|
| 0 | 0 | 0 |
| 0 | 1 | $Z^{-1}$ |
| 1 | 0 | $Z^{-1}$ |
| 1 | 1 | 1 |

Thus, when the values of the input signals A and B are at the same logic level, the output Z is set to this logic level. When the values of the input signals A and B are at different logic levels from each other, the circuit is in a standby state in which the output Z remains unchanged.

Figure 3:
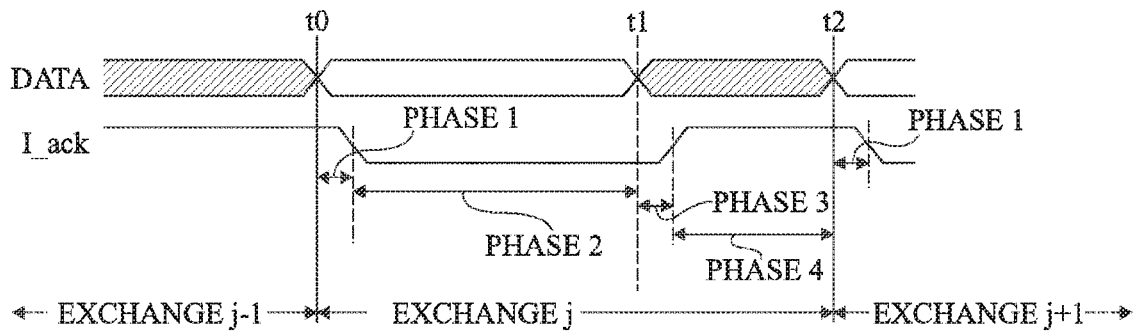
FIG. 3 is a timing diagram illustrating an example of signals implementing a handshake protocol in the circuit of FIG. 2 according to an example embodiment.

FIG. 3 is a timing diagram illustrating an example of signals of a handshake protocol implemented by the half-buffer of FIG. 2. In this example, a four-phase handshake protocol is implemented, but in alternative embodiments, a different handshake protocol could be used, such as a two-phase handshake protocol.

A data signal DATA in FIG. 3 for example represents the data provided on the input lines $I.0_0$, $I.1_0$ to $I.0_{n-1}$, $I.1_{n-1}$ of the half-buffer. The data signal DATA is for example initially low at the end of a (j−1)th exchange (EXCHANGE j−1), in other words the signals on all of the input lines are for example low. The acknowledgement signal I_ack generated by the half-buffer is for example initially high.

At a time t0 at the start of a jth exchange (EXCHANGE j), the data signal transitions, corresponding to a first phase (PHASE 1) of the handshake protocol. Assuming that the acknowledgement signal O_ack on the line 206 is high, a short while later the acknowledgement signal I_ack will go low, corresponding to a second phase (PHASE 2) of the handshake protocol.

At a time t1, the data signal DATA is brought low again, corresponding to a third phase (PHASE 3) of the handshake protocol. Assuming that the acknowledgement signal O_ack has gone low, the acknowledgement signal I_ack will thus go high again, corresponding to a fourth phase (PHASE 4) of the handshake protocol.

New data can then be transmitted in an (j+1)th exchange (EXCHANGE j+1), as shown at a time t2 in FIG. 3.

While in the example of FIG. 3 the acknowledgement signal I_ack is initially high, and then goes low when data is received, in alternative embodiments it could be initially low, and go high when data is received.

Figure 4:
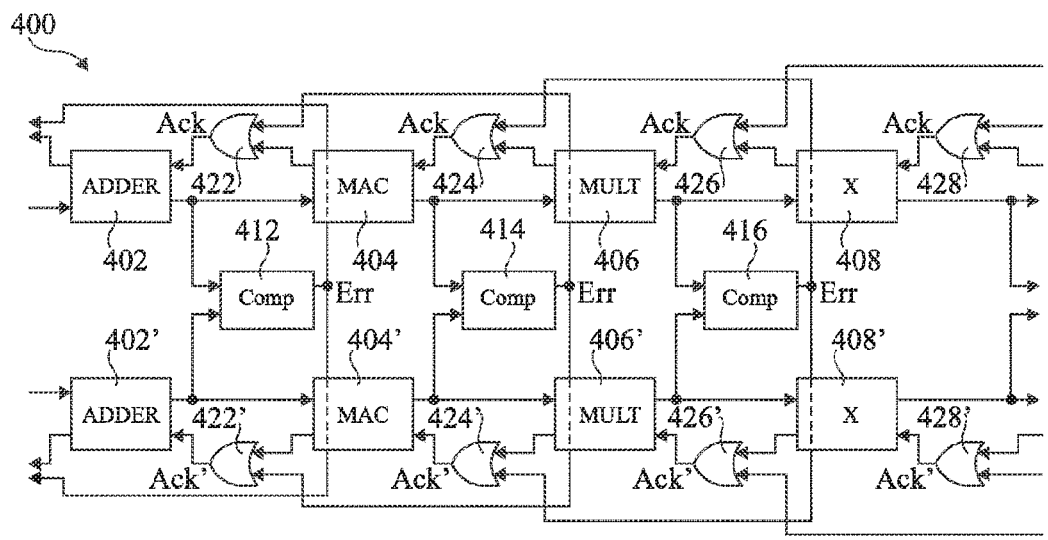
FIG. 4 schematically illustrates a radiation-hardened asynchronous pipeline according to an example embodiment of the present disclosure.

FIG. 4 schematically illustrates a radiation-hardened asynchronous pipeline 400 according to an example embodiment of the present disclosure. This pipeline is for example based on similar principles to the pipeline described above with reference to FIGS. 1 to 3.

The pipeline 400 comprises a first series of asynchronous stages, there being four such stages in FIG. 4 respectively implementing an adder (ADDER) 402, a multiplier accumulate (MAC) operator 404, a multiplier (MULT) 406, and a further stage (X) 408, which could be any type of operator. This pipeline is duplicated, the second series of stages being labelled 402', 404', 406' and 408' in FIG. 4. Thus the stages 402', 404', 406' and 408' are for example functionally equivalent to the respective stages 402, 404, 406 and 408, and will thus generate substantially identical output signals in the absence of errors. Each stage 402 to 408 and 402' to 408' for example comprises a half-buffer similar to the one of FIG. 2.

Output data lines of each stage 402, 402', 404, 404', 406, 406' and 408, 408' are provided to the subsequent stage in each pipeline, and also to the input of a corresponding comparator, three such comparators 412, 414 and 416 being illustrated in FIG. 4. The comparator 412 is coupled to the output data lines of the stages 402, 402', the comparator 414 is coupled to the output data lines of the stages 404, 404' and the comparator 416 is coupled to the output data lines of the stages 406, 406'. Each comparator 412, 414, 416 for example generates an error signal Err, which is asserted, for example to a high level, when a mismatch is detected between the data signals from corresponding pipeline stages.

An acknowledgement pause circuit 422 propagates the return acknowledgement signal to each stage. For example, an acknowledgment pause circuit 422 provides the acknowledgement signal Ack to the stage 402, and similarly acknowledgement pause circuits 422', 424, 424', 426, 426', 428 and 428' provide the acknowledgement signals Ack or Ack' to the stages 402', 404, 404', 406, 406', 408 and 408' respectively. Each of the circuits 422 to 428 and 422' to 428' has two inputs. For example, the acknowledgement pause circuit providing the acknowledgement signal to an ith stage in the pipeline has one of its inputs coupled to the acknowledgement output of the (i+1)th stage in the pipeline, and the other of its inputs coupled to the output of the comparator associated with the (i+1)th stage of the pipeline. In this way, based on the error signal Err resulting from the comparison of the data signals from the (i+1)th stage, the acknowledgement signal to the ith stage can be activated or paused.

In the example of FIG. 4, it is assumed that the acknowledgement signal goes low to inform the previous stage that the data signals can be brought low, and thus the acknowledgement pause circuits 422, 422' to 428, 428' are implemented by OR gates, which will keep the acknowledgement signals high if the comparator has a high output indicating the presence of a mismatch between the outputs of the stages. Of course, in alternative embodiments, other types of logic gate, such as an AND gate, could be used to implement the acknowledgement pause circuits, depending on the polarity of the acknowledgment signal to be generated and of the error signal.

Operation of the circuit of FIG. 4 will now be described in more detail with reference to FIG. 5.

Figure 5:
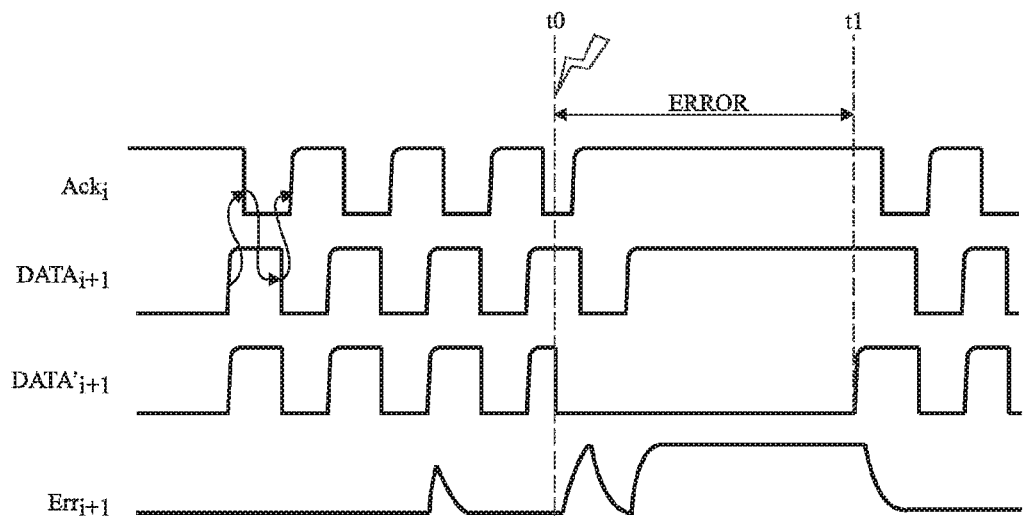
FIG. 5 is a timing diagram illustrating signals in the circuit of FIG. 4 according to an example embodiment of the present disclosure.

FIG. 5 is a timing diagram illustrating particular examples of the acknowledgement signal $Ack_i$ received by an ith stage in each of the duplicated pipelines, the data signals $DATA_{i+1}$, $DATA'_{i+1}$ generated by the (i+1)th stages of the duplicated pipelines, and the error signal $Err_{i+1}$ at the output of the comparator receiving the data signals $DATA_{i+1}$ and $DATA'_{i+1}$.

Initially, several exchange cycles are illustrated in which the error signal $Err_{i+1}$ remains low, and thus transitions in the data signals trigger a falling edge of the acknowledgement signal $Ack_i$, which in turn triggers the reset of the data signals, which in turn triggers a rising edge of the acknowledgement signal $Ack_i$.

At a time t0 in FIG. 5, it is assumed that an SEU (ERROR) occurs in the duplicated pipeline, causing the data signal $DATA'_{i+1}$ in that pipeline to fall low earlier than normal. This creates a mismatch between the data signals $DATA_{i+1}$ and $DATA'_{i+1}$, and thus the error signal $Err_{i+1}$ goes high. Thus the acknowledgement signal $Ack_i$ goes high shortly thereafter and remains high, causing data transmission through the pipeline to be paused.

When the signal $DATA_{i+1}$ goes low again, the error signal starts to fall low, but then returns high again on a subsequent rising edge of the data signal $DATA_{i+1}$, and the data signal then retains its state because the acknowledgement signal $Ack_i$ has not allowed new data to enter the ith stage. Thus the acknowledgement signal $Ack_i$ also remains high.

At a time t1, the change of state in data signal $DATA'_{i+1}$ caused by the SEU has for example reverted back to its true value, and thus the error signal $Err_{i+1}$ falls low again. This releases the acknowledgement signal $Ack_i$, and transmission through the pipeline for example proceeds. Thus the SEU results only in a pause in the data transmission, and not a reset of the data held in the pipeline.

While the embodiment of FIG. 4 provides reasonable protection against SEUs in many applications, a difficulty could occur if a further error occurs in one of the data signals of previous stages before the current error has been corrected. A further embodiment that at least partially addresses this issue will now be described with reference to FIG. 6.

Figure 6:
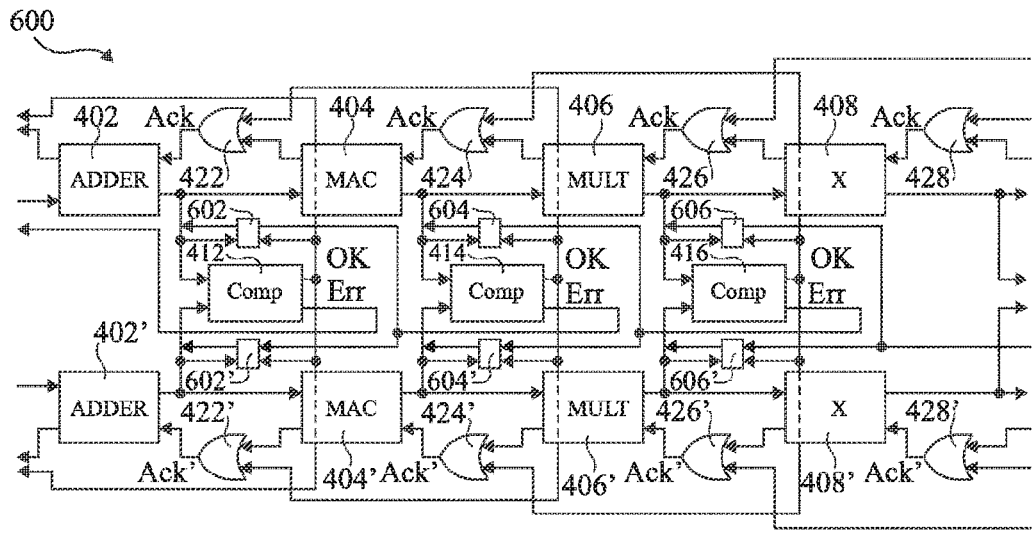
FIG. 6 schematically illustrates an asynchronous pipeline having non-volatile storage according to an example embodiment of the present disclosure.

FIG. 6 schematically illustrates an asynchronous pipeline 600, which is for example similar as the pipeline 400 of FIG. 4, and like features have been labelled with like reference numerals and will not be described again in detail. With respect to the embodiment of FIG. 4, the pipeline 600 of FIG. 6 additionally comprises non-volatile storage circuits 602, 604 and 606 respectively associated with the stages 402, 404 and 408, and non-volatile storage circuits 602', 604' and 606' respectively associated with the stages 402', 404' and 406'.

The non-volatile storage circuit associated with an ith stage in the pipeline for example has an input and an output coupled to the data output lines of the ith stage, and an input coupled to the output of the comparator of the ith stage. Furthermore, it for example has an input coupled to the output of the comparator of the (i+1)th stage. For example, the non-volatile storage circuit 602 has an input and an output coupled to the output lines of the stage 402, an input coupled to the output of the comparator 412, and an input coupled to the output of the comparator 414. Similarly, the non-volatile storage circuit 602' has an input and an output coupled to the output lines of the stage 402', an input coupled to the output of the comparator 412, and an input coupled to the output of the comparator 414.

Each non-volatile storage circuit is for example configured to store the data signals at the output of the corresponding ith pipeline stage if the comparator of the ith stage does not indicate any error, in other words the data signals match in the duplicated pipelines. Additionally, if an error is detected by the comparator of the (i+1)th stage, the non-volatile storage circuit is for example adapted to output its stored value, which will overwrite the value provided by the ith stage, such that the circuit is immune to a further SEU occurring in the ith stage. Additionally, the non-volatile storage circuits for example permit the pipelines to be reinitiated from a stored state following a reset or power down of the pipeline.

While in the example of FIG. 6 there are non-volatile storage circuits associated with each stage in both of the duplicated pipelines, in some embodiments, one of these sets of non-volatile storage circuits could be omitted. For example, the circuits 602', 604' and 606' could be omitted, and the outputs of the circuits 602, 604 and 606 could additionally be coupled to the outputs of the stages 402', 404' and 406' respectively.

Operation of the circuit of FIG. 6 will now be described in more detail with reference to the timing diagram of FIG. 7.

Figure 7:
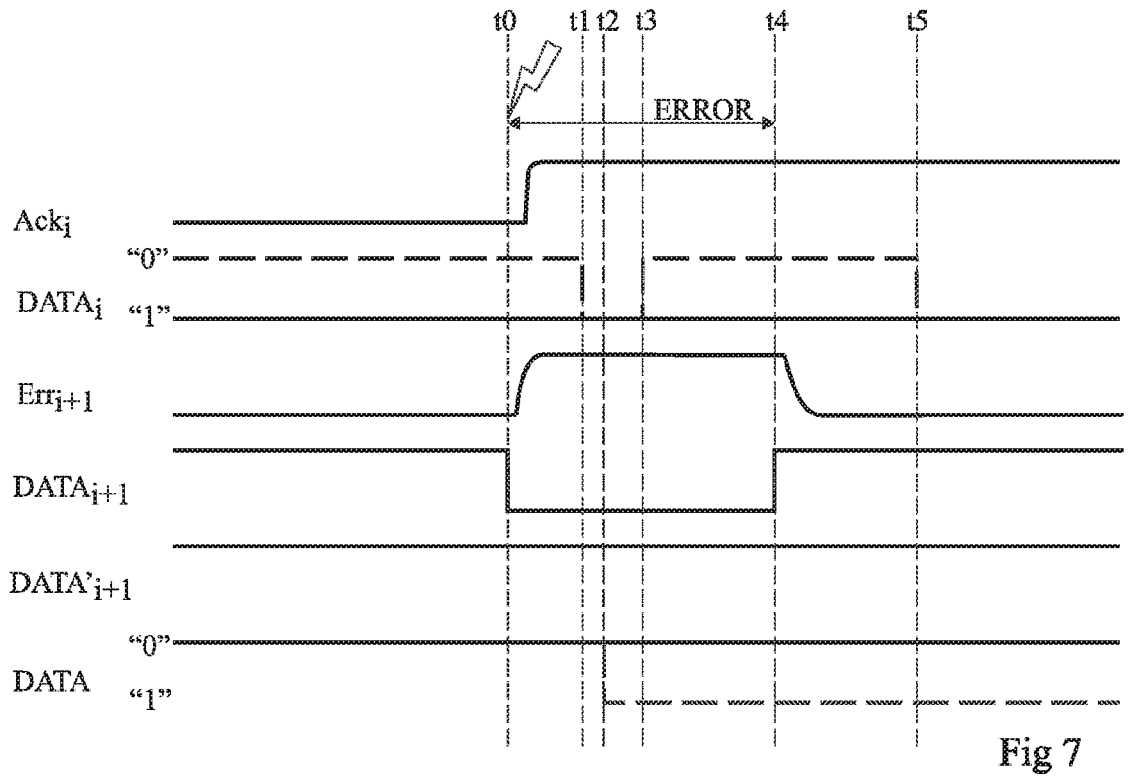
FIG. 7 is a timing diagram illustrating signals in the circuit of FIG. 6 according to an example embodiment of the present disclosure.

FIG. 7 illustrates an acknowledgement signal $Ack_i$ of an ith stage, the data signal $DATA_i$ at the output of the ith stage, the error signal $Err_{i+1}$ from the comparator of the (i+1)th stage, the data signals $DATA_{i+1}$ and $DATA'_{i+1}$ at the output of the (i+1)th stage, and the data signal DATA at the output of the non-volatile storage circuits.

In this example it is assumed that the acknowledgement signal $Ack_i$ is initially low, the "0" bit of the data signal $DATA_i$, represented by a dashed line, is initially high, the "1" bit of the data signal $DATA_i$, represented by a solid line, is initially low, the data signals $DATA_{i+1}$ and $DATA'_{i+1}$ are initially high, the "0" bit of the data signal DATA, represented by a dashed line, is initially high, the "1" bit of the data signal DATA, represented by a solid line is initially high and the error signal $Err_{i+1}$ is initially low. The states of the "0" and "1" bits of the data signal $DATA_i$ have for example been stored to the corresponding non-volatile storage circuit.

At a time t0 it is assumed that an SEU (ERROR) occurs in the pipeline, causing the data signal $DATA_{i+1}$ to fall low earlier than normal. This creates a mismatch between the data signals $DATA_{i+1}$ and $DATA'_{i+1}$, and thus the error signal $Err_{i+1}$ goes high. Thus the acknowledgement signal $Ack_i$ goes high shortly thereafter and remains high, causing data transmission through the pipeline to be paused. At time t1 the "0" bit of the data signal $DATA_i$ is forced low because the acknowledgement signal has paused the circuit.

At a time t2 shortly after the error signal $Err_{i+1}$ is asserted, the non-volatile storage device is controlled to read out the previous values of the data signal $DATA_i$ on the output lines of the ith stage. At a time t3, the signal $DATA_i$ takes the values previously stored in the non-volatile storage circuits (DATA). Once the signal $DATA_{i+1}$ recovers from the SEU at a time t4, processing continues based on the loaded value of the data signal $DATA_i$, without the risk of faults.

At a time t5, after the error signal $Err_{i+1}$ has gone low again, the "0" bit of the signal $DATA_i$ for example goes low again, ready for the next data exchange.

Figure 8A:
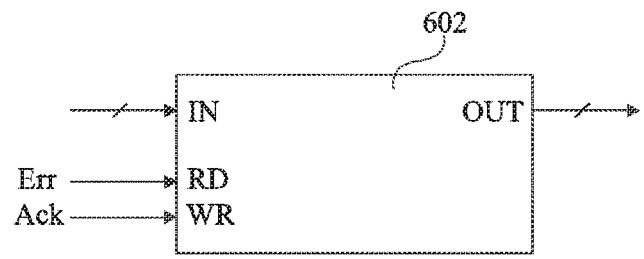
FIG. 8A illustrates a non-volatile storage circuit of FIG. 6 according to an example embodiment of the present disclosure.

FIG. 8A schematically illustrates a circuit block implementing the non-volatile storage circuit 602 in more detail according to an example embodiment. The other non-volatile storage circuits of the pipeline are for example implemented by a similar circuit block.

The circuit 602 for example receives bits of input data IN from the output lines of the corresponding ith stage, provides bits of output data OUT to the output lines of the corresponding ith stage, and receives read and write commands RD, WR. The read command RD corresponds for example to the error signal Err from the comparator of the (i+1)th stage. The write signal is for example generated by the output of the acknowledgement signal from the circuit 422.

Figure 8B:
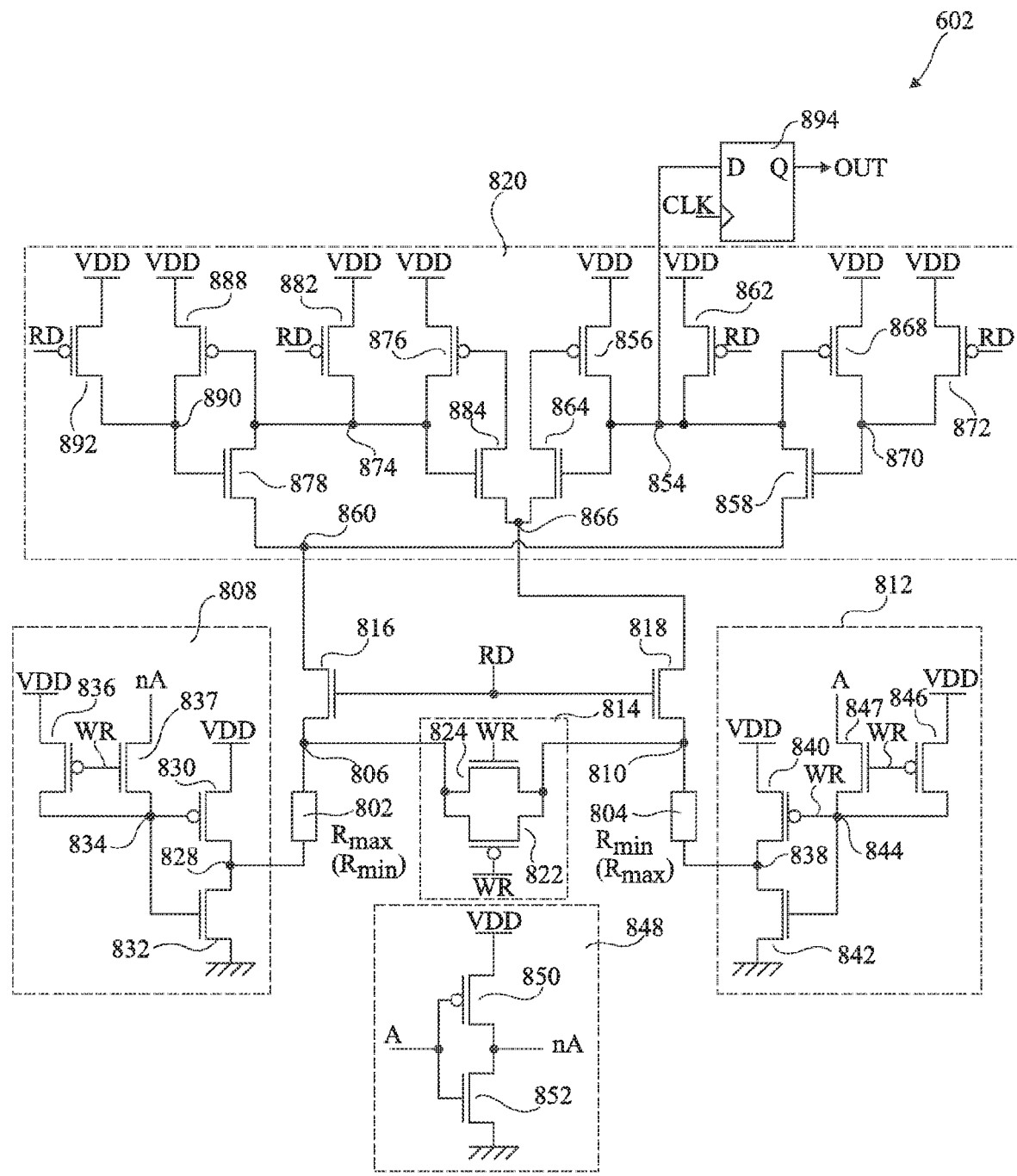
FIG. 8B illustrates the non-volatile storage circuit of FIG. 8A in more detail according to an example embodiment of the present disclosure.

FIG. 8B schematically illustrates an implementation of part of the non-volatile memory circuit 602 of FIG. 8A in more detail according to an example embodiment. This implementation corresponds to the storage of one bit of data, and in practise this circuit is for example duplicated for each of the data signals to be stored.

The circuit 602 for example comprises a pair of non-volatile elements 802, 804, which are for example programmable resistive elements. Each of these elements is for example capable of being programmed to have one of a plurality of resistive states. The resistive elements 802 and 804 may be any type of resistance switching element for which the resistance is programmable by the direction of a current passed through it.

For example, the resistance switching elements 802, 804 are spin transfer torque elements with in-plane or perpendicular-to-plane anisotropy, as described in more detail in the publication entitled "Magnonic spin-transfer torque MRAM with low power, high speed, and error-free switching", N. Mojumder et al., IEDM Tech. Digest (2010), and in the publication entitled "Electric toggling of magnets", E. Tsymbal, Natural Materials Vol 11, January 2012. An advantage of MRAM devices is that they are intrinsically robust against radiation.

Alternatively, the resistive switching elements 802, 804 could be those used in $RedO_x$ RAM (reduction oxide RAM) resistive switching memories, which are for example described in more detail in the publication entitled "Redox-Based Resistive Switching Memories—Nanoionic Mechanisms, Prospects and Challenges", Rainer Waser et al., Advanced Materials 2009, 21, pages 2632 to 2663. As yet a further example, the resistive elements could be those used in FeRAM (Ferro-Electric RAM) or in PCRAM (phase change RAM) or any memristor device.

Whatever the type of the resistive switching elements 802, 804, a bit of data is for example stored in a non-volatile manner by setting one of the elements at a relatively high resistance ($R_{max}$), and the other at a relatively low resistance ($R_{min}$). In the example of FIG. 8, the element 802 is programmed to have a resistance $R_{max}$ and the element 804 a resistance $R_{min}$ representing one value of the data bit, and as shown by the references $R_{min}$ and $R_{max}$ in brackets, the opposite programming of the resistance values stores the opposite value of the data bit.

Each of the resistance switching elements 802, 804 for example has just two resistive states corresponding to the high and low resistances $R_{max}$ and $R_{min}$, but the exact values of $R_{min}$ and $R_{max}$ may vary depending on conditions such as process, materials, temperature variations etc.

The non-volatile data bit represented by the resistive elements 802, 804 depends on which of the resistive elements is at the resistance $R_{max}$ and $R_{min}$, in other words on the relative resistances. The resistive elements 802, 804 are for example selected such that $R_{max}$ is always significantly greater than $R_{min}$, for example at least 20 percent greater. In general, the ratio between the resistance $R_{max}$ and the resistance $R_{min}$ is for example between 1.2 and 10000. $R_{min}$ is for example in the region of 2 k ohms or less, and $R_{max}$ is for example in the region of 6 k ohms or more, although many other values are possible.

It will be apparent to those skilled in the art that in some embodiments, rather than both of the resistive elements 802, 804 being programmable, only one is programmable. In such a case, the other resistive element for example has a fixed resistance at an intermediate level around halfway between $R_{min}$ and $R_{max}$, for example equal, within a 10 percent tolerance, to $(R_{min}+(R_{max}-R_{min})/2)$. For example, one of the resistive elements 802, 804 could correspond to a resistor of fixed resistance. Alternatively, one of the resistive elements 802, 804 could be formed of a pair of programmable resistive elements coupled in parallel with each other and in opposite orientations, such that irrespective of the sense in which each element is programmed, the resistance value remains relatively constant at the intermediate level.

The element 802 is for example coupled between a node 806 and a first write circuit 808. The element 804 is for example coupled between a node 810 and a second write circuit 812. The nodes 806 and 810 are for example coupled together via a switch 814 controlled by the write signal WR. Furthermore, the nodes 806 and 810 are for example coupled via respective transistors 816 and 818 to a read circuit 820. The transistors 816 and 818 are for example controlled by the read signal RD.

The switch 814 for example comprises a PMOS transistor 822 and an NMOS transistor 824 each coupled by their main conducting nodes between the nodes 806 and 810. The transistor 822 is for example controlled by the inverse $\overline{WR}$ of the write signal WR, and the transistor 824 is for example controlled by write signal WR. The transistors 822 and 824 are rendered conductive during a write phase, such that the current is passed through the elements 802 and 804 in a direction from the circuit 808 to towards the circuit 812, or in the opposite direction, depending on the data bit to be stored.

The first write circuit 808 for example comprises a node 828 coupled to the element 802, and also to a supply voltage rail VDD via a PMOS transistor 830, and to ground via an NMOS transistor 832. The gates of transistors 830 and 832 are coupled to a node 834, which is in turn coupled via a PMOS transistor 836 to the supply voltage rail VDD. Furthermore, the node 834 is coupled to an input line receiving the inverse nA of an input data signal A via a transistor 837. The transistors 836 and 837 are controlled at their gate nodes by the write signal WR.

Similarly, the second write circuit 812 for example comprises a node 838 coupled to the element 804, and also to the supply voltage rail VDD via a PMOS transistor 840, and to ground via an NMOS transistor 842. The gates of transistors 840 and 842 are coupled to a node 844, which is in turn coupled via a PMOS transistor 846 to the supply voltage rail VDD. Furthermore, the node 844 is coupled to an input line receiving the input data signal A via a transistor 847. The transistors 846 and 847 are controlled at their gate nodes by the write signal WR.

As represented by the circuit 848, the signal nA is for example generated by applying the signal A to the input of an inverter for example formed of a PMOS transistor 850 and an NMOS transistor 852.

In operation, the signal A corresponds to one bit of the data input signal IN of the circuit, and when the write signal WR is asserted, a write current is driven through the elements 802 and 804 in a direction based on the signal A.

The read circuit 820 in the example of FIG. 8B is for example capable of generating an output bit by detecting the relative programmed resistances of the resistive elements 802, 804 when the read signal RD is asserted. Furthermore, the circuit is for example radiation hardened to reduce the risk of a SEU causing an error to be propagated by the circuit.

The read circuit 820 for example comprises a node 854 that provides the output bit read from the resistive elements 802, 804. The node 854 is coupled to the supply voltage rail VDD via transistor 856 and to a node 860 via an NMOS transistor 858. The node 860 is coupled to a main conducting node of the NMOS transistor 816. The node 854 is also coupled via a PMOS transistor 862 to the supply voltage rail VDD, the transistor 862 being controlled by the read signal RD. A transistor 864 has its gate coupled to the node 854, and its main conducting nodes respectively coupled to the gate of the transistor 856 and to a further node 866 in turn coupled to the transistor 818. A PMOS transistor 868 for example has its gate coupled to the node 854, and its main conducting nodes respectively coupled to the supply voltage rail VDD and a further node 870. The node 870 is further coupled via a transistor 872 to the supply voltage rail VDD, the transistor 872 for example being a PMOS transistor controlled at its gate by the read signal RD.

The read circuit 820 also for example comprises a node 874 coupled to the supply voltage rail VDD via transistor 876 and to the node 860 via an NMOS transistor 878. The node 874 is also coupled via a PMOS transistor 882 to the supply voltage rail VDD, the transistor 882 being controlled by the read signal RD. A transistor 884 has its gate coupled to the node 874, and its main conducting nodes respectively coupled to the gate of the transistor 876 and to the node 866. A PMOS transistor 888 for example has its gate coupled to the node 874, and its main conducting nodes respectively coupled to the supply voltage rail VDD and a further node 890. The node 890 is further coupled via a transistor 892 to the supply voltage rail VDD, the transistor 892 for example being a PMOS transistor controlled at its gate by the read signal RD.

The node 854 is for example coupled via a flip-flop 894, clocked by a clock signal CLK, to an output OUT of the non-volatile storage circuit.

In operation, when the read signal RD is asserted, the transistors 816 and 818 are rendered conductive. Furthermore, the transistors 862, 872, 882 and 892 are rendered non-conductive. The transistors 856, 864, 876 and 884 will thus conduct currents forming a first read current through the transistor 818, and the transistors 878, 888, 858 and 868 will thus conduct currents forming a second read current through the transistor 816. These currents will cause the voltages at the nodes 854 and 874 to swing based on the programmed resistances of the elements 802 and 804.

While the embodiments of FIGS. 6 and 8 described above concern an asynchronous pipeline, in alternative embodiments the same principles could be applied to other types of circuits providing asynchronous communications, as will now be described with reference to FIG. 9.

Figure 9:
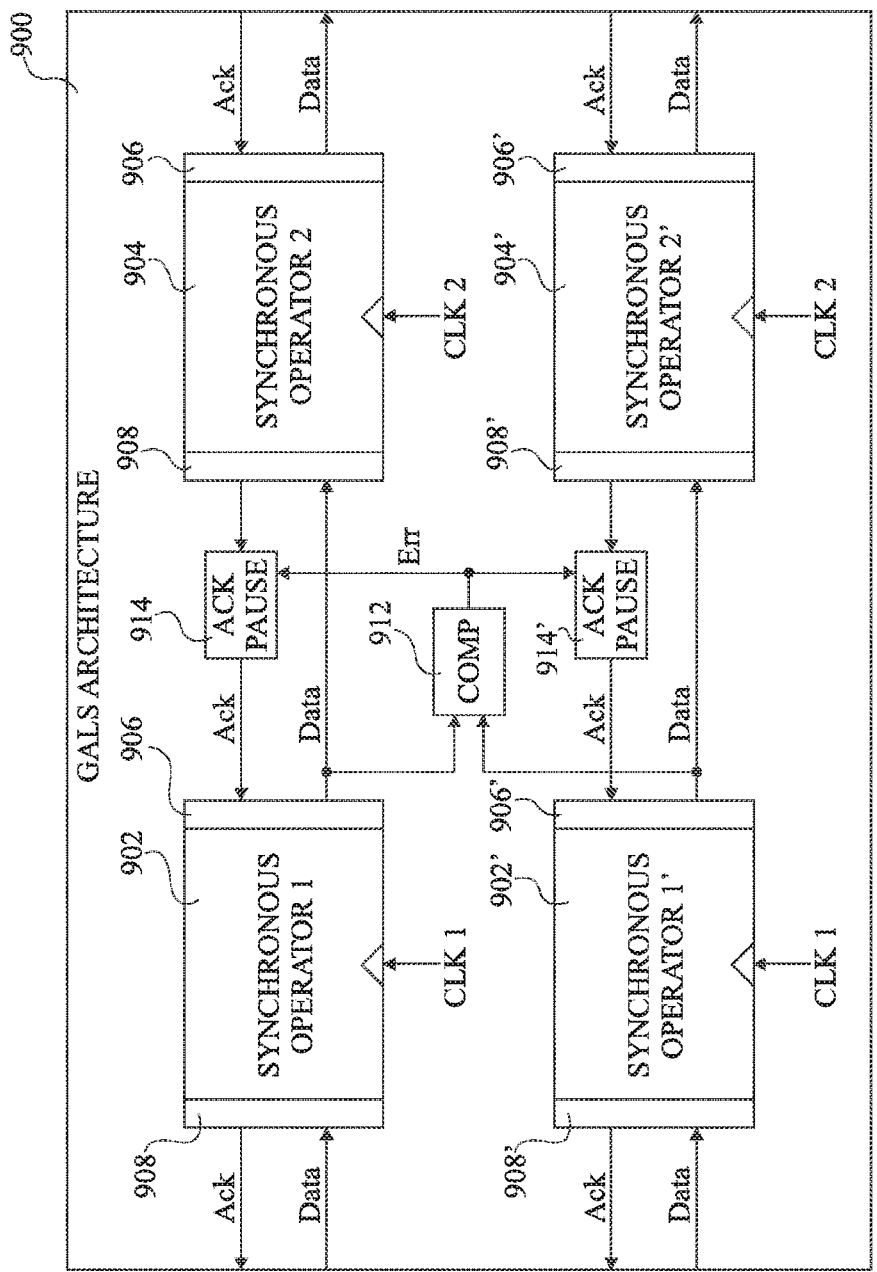
FIG. 9 schematically illustrates an asynchronous communications interface between circuits according to an example of the present disclosure.

FIG. 9 schematically illustrates a GALS (globally asynchronous, locally synchronous) architecture (GALS ARCHITECTURE) 900 comprising a pair of circuits 902, 904, which are for example each synchronous and capable of communicating with each other in an asynchronous fashion, and a further pair of circuits 902', 904', which are for example functionally equivalent to the circuits 902, 904 respectively. For example, the circuits 902, 902' respectively correspond to a synchronous operator 1 (SYNCHRONOUS OPERATOR 1) and its duplication (SYNCHRONOUS OPERATOR 1') controlled by a clock signal CLK1, and the circuits 904, 904' respectively corresponding to a synchronous operator 2 (SYNCHRONOUS OPERATOR 2) and its duplication (SYNCHRONOUS OPERATOR 2') controlled by clock signal CLK2.

In the example of FIG. 9, the circuits 902 and 902' communicate with the circuits 904, 904' in both directions. The asynchronous interfaces between the circuits 902, 904 and between the circuits 902', 904' for example each comprise one or more data lines (DATA) and an acknowledgement line ACK. The circuits 902, 902' each for example respectively comprise an asynchronous wrapper 906, 906' forming an interface between the synchronous portions of the circuits and the asynchronous interface. Similarly, the circuits 904, 904' each for example respectively comprise an asynchronous wrapper 908, 908' forming an interface between the synchronous portions of the circuits and the asynchronous interface. In some embodiments, either or both of the circuits 902, 902' also communicates with further circuits (not illustrated in FIG. 9) via further data and acknowledgement lines, for example coupled to asynchronous wrappers 908, 908' of the circuits 902, 902'. Additionally or alternatively, either or both of the circuits 904, 904' also communicates with further circuits (not illustrated in FIG. 9) via further data and acknowledgement lines, for example coupled to asynchronous wrappers 906, 906' of the circuits 904, 904'.

The one or more data lines forming the interface between the circuits 902 and 904 are for example coupled to a comparator (COMP) 912, which compares the signals on the corresponding data lines, and asserts an error signal Err at its output when there is a mismatch between any of the signals. This error signal Err is passed to acknowledgement pause circuits 914 and 914' (ACK PAUSE) respectively coupled in the paths of the acknowledgement signals generated by the circuits 904 and 904'. Thus a detected mismatch between the data signals will cause the acknowledgement signals to be paused until the data recovers its correct value.

An advantage of the embodiments described herein is that error detection and correction can be performed for asynchronous communications without increasing, by more than a factor of around two, the surface area and power consumption of the circuit.

Having thus described at least one illustrative embodiment, various alterations, modifications and improvements will readily occur to those skilled in the art. For example, while in the embodiments of FIGS. 4 and 6 the detection of a mismatch between data signals of (i+1)th stages is used to pause the acknowledgement signals to ith stages, in alternative embodiments they could be used to pause acknowledgement signals to the (i+1)th stages or to earlier stages before the ith stages.

Furthermore, while an implementation has been described with reference to FIG. 8B in which a non-volatile storage circuit is implemented using resistive switching elements programmable by the direction of a current that is passed through them, in alternative embodiments other technologies of non-volatile data storage could be used, with appropriate circuit designs for programming and reading to one or more storage elements. Furthermore, other implementations of the circuit of FIG. 8B would be possible, for example based on one or more of the circuits described in the publication by R. Rajaei et al. entitled "Soft Error-Tolerant Design of MRAM-based Non-Volatile Latches for Sequential Logics", IEEE TRANSACTIONS ON MAGNETICS, November 2014, the contents of which is hereby incorporated by reference to the extent permitted by the law.

Furthermore, it will be apparent to those skilled in the art that the supply voltage VDD in the various embodiments could be at any level, for example between 1 and 3 V, and rather than being at 0 V, the ground voltage can also be considered as a supply voltage that could be at any level, such as a negative level.

Furthermore, it will be apparent to those skilled in the art that, in any of the embodiments described herein, all of the NMOS transistors could be replaced by PMOS transistors and/or all of the PMOS transistors could be replaced by NMOS transistors. It will be apparent to those skilled in the art how any of the circuits could be implemented using only PMOS or only NMOS transistors, for example by inverting the supply rails. Furthermore, while transistors based on MOS technology are described throughout, in alternative embodiments other transistor technologies could be used, such as bipolar technology.

Furthermore, it will be apparent to those skilled in the art that the various circuits described herein could be implemented in bulk silicon, or in a silicon on insulator (SOI) structure. For example, the circuits could be implemented using FD-SOI (Fully Depleted SOI) technology. An advantage of SOI structures is that, due to their local insulation of the substrate, they provide good robustness from errors resulting from radiation. Furthermore, in such structures, body biasing can be used to accelerate the writing of non-volatile elements.

Furthermore, it will be apparent to those skilled in the art that the various features described in relation to the various embodiments could be combined, in alternative embodiments, in any combination. For example, the non-volatile storage circuits of the circuit of FIG. 9 could be implemented by the non-volatile storage circuit of FIGS. 8A and 8B.

The invention claimed is:

1. An asynchronous circuit comprising:
   a first circuit adapted to receive, from a first further circuit, a first data input signal on a first data input line and to generate a first acknowledgement signal and a first data output signal;
   a second circuit adapted to receive, from a second further circuit, a second data input signal on a second data input line and to generate a second acknowledgement signal and a second data output signal, the second circuit being functionally equivalent to the first circuit;
   a comparator adapted to detect a mismatch between the first and second data output signals;
   a further comparator adapted to detect a mismatch between the first and second data input signals;

at least one acknowledgement pause circuit adapted to prevent the propagation of the first and second acknowledgement signals to the first and second further circuits if a mismatch is detected by the comparator or by the further comparator; and a non-volatile memory circuit coupled to the first data input line and adapted to store a first value of the first data input signal when the further comparator does not indicate a mismatch between the first and second data input signals.

2. The asynchronous circuit of claim 1, wherein the non-volatile memory circuit is further adapted to output the stored first value in response to a detected mismatch between the first and second output data signals.

3. The asynchronous circuit of claim 2, wherein the non-volatile memory circuit is adapted to output the stored first value on data lines transmitting the first and second data input signals.

4. The asynchronous circuit of claim 1, wherein the non-volatile memory circuit comprises at least one non-volatile storage element programmable to maintain, in a non-volatile fashion, one of a plurality of resistive states.

5. The asynchronous circuit of claim 1, wherein the at least one acknowledgement pause circuit is adapted to propagate the first and second acknowledgement signals either once the comparator indicates a match between the first and second data input signals or once the comparator indicates a match between the first and second data output signals.

6. The asynchronous circuit of claim 1, wherein each at least one acknowledgement pause circuit is a logic gate adapted to receive the first or second acknowledgement signal and an output signal of the comparator.

7. The asynchronous circuit of claim 1, wherein the first and second circuits are synchronous reception circuits, and:
the first further circuit is a first synchronous transmission circuit adapted to generate the first data input signal and to transmit it to the first circuit; and
the second further circuit is a second synchronous transmission circuit adapted to generate the second data input signal and to transmit it to the second circuit.

8. An asynchronous pipeline comprising the asynchronous circuit of claim 1, wherein the asynchronous pipeline comprises:
a first sub-pipeline comprising a first plurality of stages of which one comprises said first circuit; and
a second sub-pipeline comprising a second plurality of stages of which one comprises said second circuit.

9. A method of detecting and correcting single event upsets in an asynchronous circuit comprising:
receiving by a first circuit from a first further circuit a first data input signal on a first data input line and generating by the first circuit a first acknowledgement signal and a first data output signal;
receiving by a second circuit from a second further circuit a second data input signal on a second data input line and generating by the second circuit a second acknowledgement signal and a second data output signal, the second circuit being functionally equivalent to the first circuit;
comparing, by a comparator, the first and second data output signals to detect a mismatch;
comparing, by a further comparator, the first and second data input signals to detect a mismatch;
preventing, by at least one acknowledgement pause circuit, the propagation of the first and second acknowledgement signals to the first and second further circuits if a mismatch is detected between the first and second data input signals or the first and second data output signals; and
storing to a non-volatile memory circuit coupled to the first data input line a first value of the first data input signal when the further comparator does not indicate a mismatch between the first and second data input signals.

\* \* \* \* \*